(12) United States Patent
Chopra et al.

(10) Patent No.: US 9,852,240 B2
(45) Date of Patent: Dec. 26, 2017

(54) SYSTEMS AND METHODS FOR GAS TURBINE OPERATIONAL IMPACT MODELING USING STATISTICAL AND PHYSICS-BASED METHODOLOGIES

(71) Applicants: Seema Chopra, Bangalore (IN); David Purnell, Greenville, SC (US); Shridhar Raghuvir Powar, Bangalore (IN); John Robert Korsedal, Greenville, SC (US); Christopher Farral, Greenville, SC (US); Jenfu Yau, Greenville, SC (US)

(72) Inventors: Seema Chopra, Bangalore (IN); David Purnell, Greenville, SC (US); Shridhar Raghuvir Powar, Bangalore (IN); John Robert Korsedal, Greenville, SC (US); Christopher Farral, Greenville, SC (US); Jenfu Yau, Greenville, SC (US)

(73) Assignee: General Electric Company, Schenectday, NY (US)

( * ) Notice: Subject to any disclaimer, the term of this patent is extended or adjusted under 35 U.S.C. 154(b) by 659 days.

(21) Appl. No.: 14/338,912

(22) Filed: Jul. 23, 2014

(65) Prior Publication Data

US 2016/0026739 A1 Jan. 28, 2016

(51) Int. Cl.
*G06F 7/60* (2006.01)
*G06F 17/10* (2006.01)
(Continued)

(52) U.S. Cl.
CPC .......... *G06F 17/5009* (2013.01); *G07C 3/00* (2013.01); *G07C 3/14* (2013.01)

(58) Field of Classification Search
None
See application file for complete search history.

(56) References Cited

U.S. PATENT DOCUMENTS 3,731,070 A * 5/1973 Urban .................. G07C 3/00
701/100
2009/0326782 A1* 12/2009 Nunn .................. G05B 19/042
701/100

(Continued)

FOREIGN PATENT DOCUMENTS

EP 2541145 A1 1/2013

*Primary Examiner* — Craig Dorais
(74) *Attorney, Agent, or Firm* — Eversheds Sutherland (US) LLP (57) ABSTRACT

Systems and methods for gas turbine operational impact modeling using statistical and physics-based methodologies are disclosed. According to one embodiment of the disclosure, a method can include receiving, by one or more processors, operational conditions data associated with a hardware component of a gas turbine; based at least in part on the operational variation data, applying, by one or more processors, statistical methods to establish an operational profile of the hardware component; receiving, by one or more processors, operating parameters and operational conditions data associated with the hardware component; based at least in part on the operating parameters and the operational conditions data, applying, by one or more processors, physics-based methods to establish an operational impact factor of the hardware component; and based at least in part on the operational profile and the operational impact factor determining, by one or more processors, a probability of a failure of the hardware component within a time period.

19 Claims, 4 Drawing Sheets

(51) Int. Cl.
  *G06F 17/50* (2006.01)
  *G07C 3/14* (2006.01)
  *G07C 3/00* (2006.01)

(56) References Cited

U.S. PATENT DOCUMENTS

| | | | | |
|---|---|---|---|---|
| 2011/0153295 | A1* | 6/2011 | Yerramalla | F02C 9/00 703/7 |
| 2012/0059631 | A1* | 3/2012 | Heinzerling | G01C 21/20 703/2 |
| 2013/0261876 | A1* | 10/2013 | Froom | B64F 5/0045 701/29.3 |

* cited by examiner

SYSTEMS AND METHODS FOR GAS TURBINE OPERATIONAL IMPACT MODELING USING STATISTICAL AND PHYSICS-BASED METHODOLOGIES

TECHNICAL FIELD

This disclosure relates generally to the operation of gas turbines, and more particularly, to systems and methods for gas turbine operational impact modeling using statistical and physics-based methodologies.

BACKGROUND

Gas turbines operate at high temperatures and high rotational speeds that can cause certain hardware components to fail. Among hardware components that may fail are, for example, airslots, inner tangs, combustor liners, and lockwires.

Many gas turbine hardware components' actual useful service lives are highly variable, and many such hardware components can be relatively expensive to replace. Consequently, some existing solutions aim to predict the remaining service life of a specific hardware component. Physical methods of determining a hardware component's remaining service life may involve taking the gas turbine out of service for physical inspection and testing. Based on the design of the component and the stresses it experiences under specified operating conditions, it is possible to predict the component's remaining service life from its physical condition with some accuracy. However, having a gas turbine out of service is expensive, and many repairs to gas turbines may require hours or days to return from an out-of-service state to a service-ready state.

Statistical methods of determining a hardware component's remaining service life may employ historical data about the service life of reference hardware components in the same gas turbine and in other gas turbines of the same design and similar designs. Such methods can be inaccurate because the variability in a hardware component's service life makes it difficult to accurately predict the hardware component's remaining service life. Consequently the hardware component must be replaced conservatively to avoid a significant risk of in-service failure. In some cases the hardware component may be replaced prematurely, that is, when it had a substantial remaining service life. Such premature replacement of a hardware component can be relatively expensive both because the component itself may be expensive, and because replacement may require taking the gas turbine out of service prematurely.

SUMMARY OF THE DISCLOSURE

This disclosure relates to systems and methods operational impact modeling using statistical and physics-based methodologies. According to one embodiment of the disclosure, a method for operational impact modeling can include receiving, by one or more processors, operational conditions data associated with a hardware component of a gas turbine; based at least in part on the operational variation data, applying, by one or more processors, statistical methods to establish an operational profile of the hardware component; receiving, by one or more processors, operating parameters and operational conditions data associated with the hardware component; based at least in part on the operating parameters and the operational conditions data, applying, by one or more processors, physics-based methods to establish an operational impact factor of the hardware component; and based at least in part on the operational profile and the operational impact factor determining, by one or more processors, a probability of a failure of the hardware component within a time period.

According to another embodiment of the disclosure, a system for operational impact modeling can include one or more processors operable to receive operational conditions data from one or more sensors associated with a gas turbine; a physics based analysis technique operable to generate an operational impact factor based at least in part on the operational conditions data; a database and real time operational model including historical operational conditions data associated with the hardware component of the gas turbine; a comparison module operable to generate operational variation data based at least on the operational conditions data and the historical and real-time operational conditions data; a statistical methods module operable to generate an operational profile based at least in part on the operational variation data; and a prediction module operable to generate a probability of a failure of the hardware component within a specified time period based at least in part on the operational impact factor and the operational profile.

Other embodiments, systems, methods, features, and aspects will become apparent from the following description taken in conjunction with the following drawings.

DETAILED DESCRIPTION

The following detailed description includes references to the accompanying drawings, which form part of the detailed description. The drawings depict illustrations, in accordance with example embodiments. These example embodiments, which are also referred to herein as "examples," are described in enough detail to enable those skilled in the art to practice the present subject matter. The example embodiments may be combined, other embodiments may be utilized, or structural, logical, and electrical changes may be made, without departing from the scope of the claimed subject matter. The following detailed description is, therefore, not to be taken in a limiting sense, and the scope is defined by the appended claims and their equivalents.

Certain embodiments of the disclosure concern methods and systems which allow monitoring the operation of a gas turbine and predicting failure of hardware components of the gas turbine using a combination of physics-based methods and statistical methods, yielding more accurate estimates of hardware component's remaining service life. The disclosed methods and systems may provide for modeling the condition and service life of components of a gas turbine.

In some example embodiments, a processor may receive and store operational conditions data from sensors associated with the turbine. Current and historical (stored) operational conditions data can be compared, generating operational variation data, which may also be stored. Statistical methods may be applied to the operational variation data, generating an operational profile, which may be used to predict the probability of failure of a component in a specified time period. Physics-based methods may be applied to the current and historical operational conditions data and the operating parameters associated with the turbine's controls, generating an operational impact factor, which is a further input to the prediction of the probability of failure. The operational impact factor, the probability of failure, and the current operational conditions data may be used to generate feedback which affects the settings of the turbine's controls.

Technical effects of certain embodiments of the disclosure can include modeling the condition and service life of components of a gas turbine. Further technical effects of certain embodiments of the disclosure can include monitoring the operation of a gas turbine and predicting failure of hardware components of the gas turbine using a combination of physics-based methods and statistical methods.

The following provides the detailed description of various example embodiments related to systems and methods for operational impact modeling using statistical and physics-based methodologies.

Figure 1:
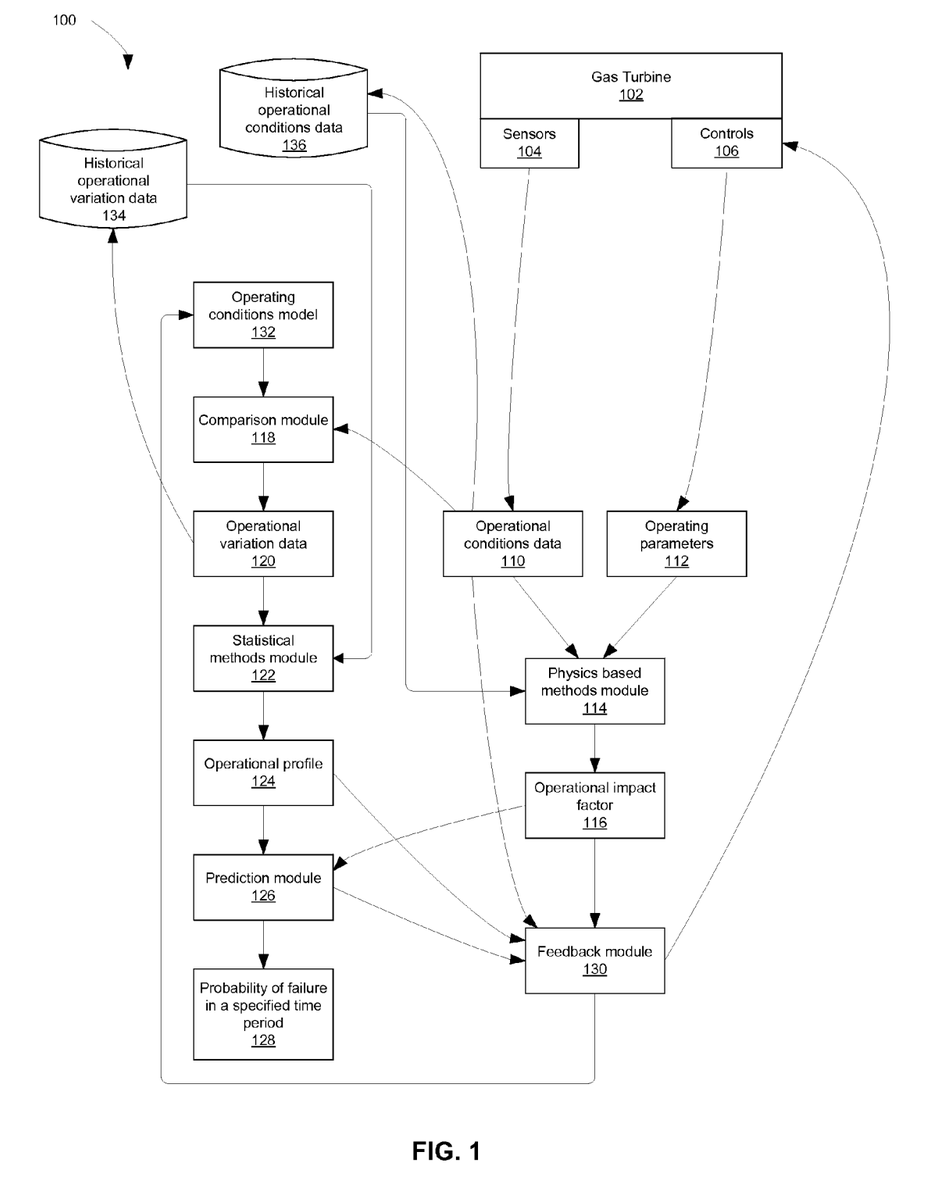
FIG. 1 is a flow diagram illustrating an example method for gas turbine operational impact modeling according to an embodiment of the disclosure.

FIG. 1 shows an example method for operational impact modeling according to one embodiment of the disclosure. A gas turbine 102 can include one or more hardware components, one or more sensors 104 which can detect operating conditions data 110 associated with the one or more hardware components 103, and one or more controls 106 which can set operating parameters 112 associated with the one or more hardware components 103. The operating conditions data 110 may include, for example, gas temperature and pressure. The operating parameters 112 may include, for example, fuel pattern variations and inlet chiller activation.

One or more processors may receive the operational conditions data 110 from the sensors 104 and the operating parameters 112 from the controls 106 and perform the example processing operations shown in FIG. 1 and described in more detail below. The one or more processors may perform the same operations or different operations. The operational conditions data 110 may include one or more of a compressor discharge temperature, an ambient temperature, DRY load NOX mode of operation, firing temperature, and load of the gas turbine.

A physics-based methods module 114 may process the operational conditions data 110, the operating parameters 112, and a body of historical operational conditions data 136, establishing an operational impact factor 116 for each of the one or more hardware components 103. The historical operational conditions data 136 may represent past observations of how various operational conditions have affected the service life of the one or more hardware components 103 in the gas turbine 102 and in other gas turbines of the same or similar types. The physics-based methods module 114 may at least in part employ methods based on types of failures known to occur to each hardware component 103 and the changes in the historical operational conditions data 136 that have been associated with development of each type of failure in the past. The operational impact factor 116 may include a number which describes the service life of the one or more hardware components 103 under operational conditions represented by the operational conditions data 110. The service life of the one or more hardware components 103 under the operational conditions represented by the operational conditions data 110 may be equal to the service life of the one or more hardware components 103 under a standard set of operational conditions multiplied by the operational impact factor 116.

The operational conditions data 110 may be further incorporated into the historical operational conditions data 136, thereby enlarging the body of historical operational conditions data 136 that will be available in the future to the physics-based methods module 114.

A comparison module 118 may process the operational conditions data 110 and data retrieved from an operating conditions model 132, thereby computing operational variation data 120. The operating conditions model 132 may describe the operation of the gas turbine 102 and other gas turbines of the same type and/or similar types. The operational variation data 120 may describe differences between the operational conditions data 110 received from the sensors 104 and the operational conditions data which the operating conditions model 132 predicts will be reported by a gas turbine operating with the same and/or similar operating parameters 112.

The operational variation data 120 can be further incorporated into a body of historical operational variation data 134. The historical operational variation data 134 can include operational variation data associated with the hardware components 103 during the period when the hardware components 103 have been in service and operational variation data associated with corresponding reference hardware components in other gas turbines of the same type and similar types.

A statistical methods module 122 may process the operational variation data 120 and data retrieved from the historical operational variation data 134, thereby establishing an operational profile 124. The statistical methods module 122 may establish the operational profile 124 by using one or more statistical algorithms to compare the operational variation data 120 to the historical operational variation data 134, and based at least in part on the comparison, profile each hardware component 103. Profiling a hardware component 103 may include attributing hardware failures of corresponding reference hardware components operating under substantially similar operational variations to the hardware component.

A prediction module 126 may process the operational profile 124 and the operational impact factor 116, thereby computing a probability of a failure of each of the one or more hardware components 103 in a specified time period 128. The types of failure of the one or more hardware components 103 may include one or more of the following: an airslot cracking, an inner tang cracking, a combustor liner deformation, a combustor liner cracking, and a lockwire tap.

A feedback module 130 may process the operational conditions data 110, the operational impact factor 116, the operational profile 124, and the probability of failure in a specified time period 128, thereby triggering remedial actions to lower the probability of the failure. The remedial actions may include adjustments to the operating parameters 112 of the gas turbine 102, which the feedback module 130 may communicate the adjustments to the controls 106. The controls 106 may apply the adjustments to the gas turbine. The remedial actions may include activating one or more inlet chillers associated with the gas turbine. The prediction module 126 may further determine an inspection frequency for each of the one or more hardware components 103, the inspection frequency being derived from the probability of failure of the hardware component 103 within a specified time period.

Figure 2:
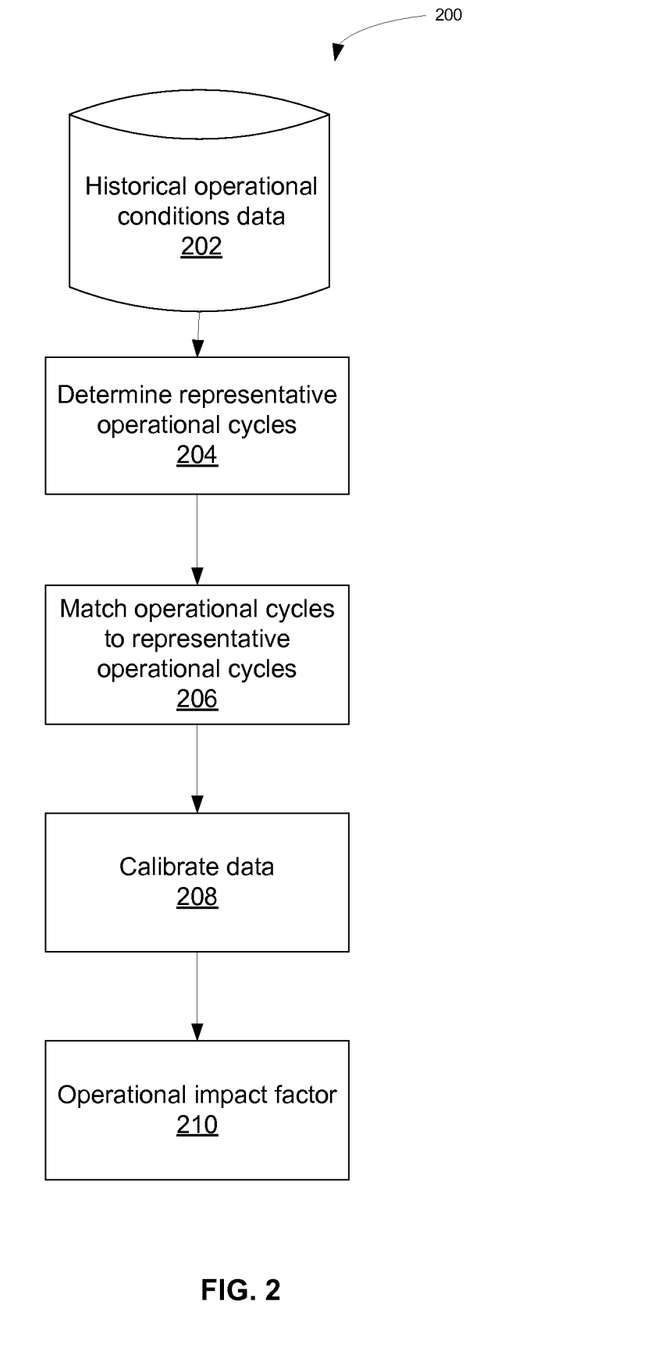
FIG. 2 is a flow diagram depicting example operations in computing an operational impact factor in the example method illustrated in FIG. 1 according to an embodiment of the disclosure.

FIG. 2 shows an example method 200 for deriving an operational impact factor 116 of FIG. 1 according to an embodiment of the disclosure. It will be understood that the method 200 may derive an operational impact factor for each of one or more hardware components of a gas turbine operating under each of one or more specific sets of conditions.

The method 200 may commence by determining one or more representative operational cycles in operation 204 by analyzing a body of historical operational conditions data 202. The historical operational conditions data 202 may comprise historical data concerning each of the one or more hardware components in each of a plurality of gas turbines of the same or similar types as the gas turbine. The historical data associated with each hardware component in each gas turbine may comprise the hardware component's actual service life measured in hours of service and the hardware component's operational conditions data at intervals during the hardware component's life.

An operational cycle may include a pattern of operational conditions over a period of time. An example of an operational cycle may include operation under peak load for a specific period of time such as a week, the period of time being selected to correspond with a cyclic pattern of demand. The determination of the one or more representative operational cycles may be performed in operation 204 by employing statistical methods such as cluster analysis to identify groups of historical operational cycles that represent instances of one or more representative operational cycles.

The method 200 may proceed by matching historical operational cycles to the one or more representative operational cycles in operation 206. A historical operational cycle may include an operational cycle that corresponds to a set of historical operational conditions data 202 that represents a single gas turbine over a specified period of time. It will be understood that matching historical operational cycles to the one or more representative operational cycles, illustrated by operation 204, may include identifying historical operational cycles that represent the same period of time as a representative operational cycle and start at a point in time which yields a best fit to the representative operational cycle.

The method 200 may then proceed with calibrating the data in operation 208. Calibrating the data may be followed by computing the operational impact factor in operation 210 for each of the one or more hardware components of the gas turbine under the operational conditions associated with each of the one or more representative operational cycles. The operational impact factor for a specific hardware component and a specific operational cycle may be defined as LC/LS, wherein LC is the remaining service life of the specific hardware component under the operational conditions associated with the specific operational cycle shown in operation 204, and LS is the remaining service life of the specific hardware component under the standard set of operational conditions. The values of LC and LS are derived from the historical operational conditions data 202.

Figure 3:
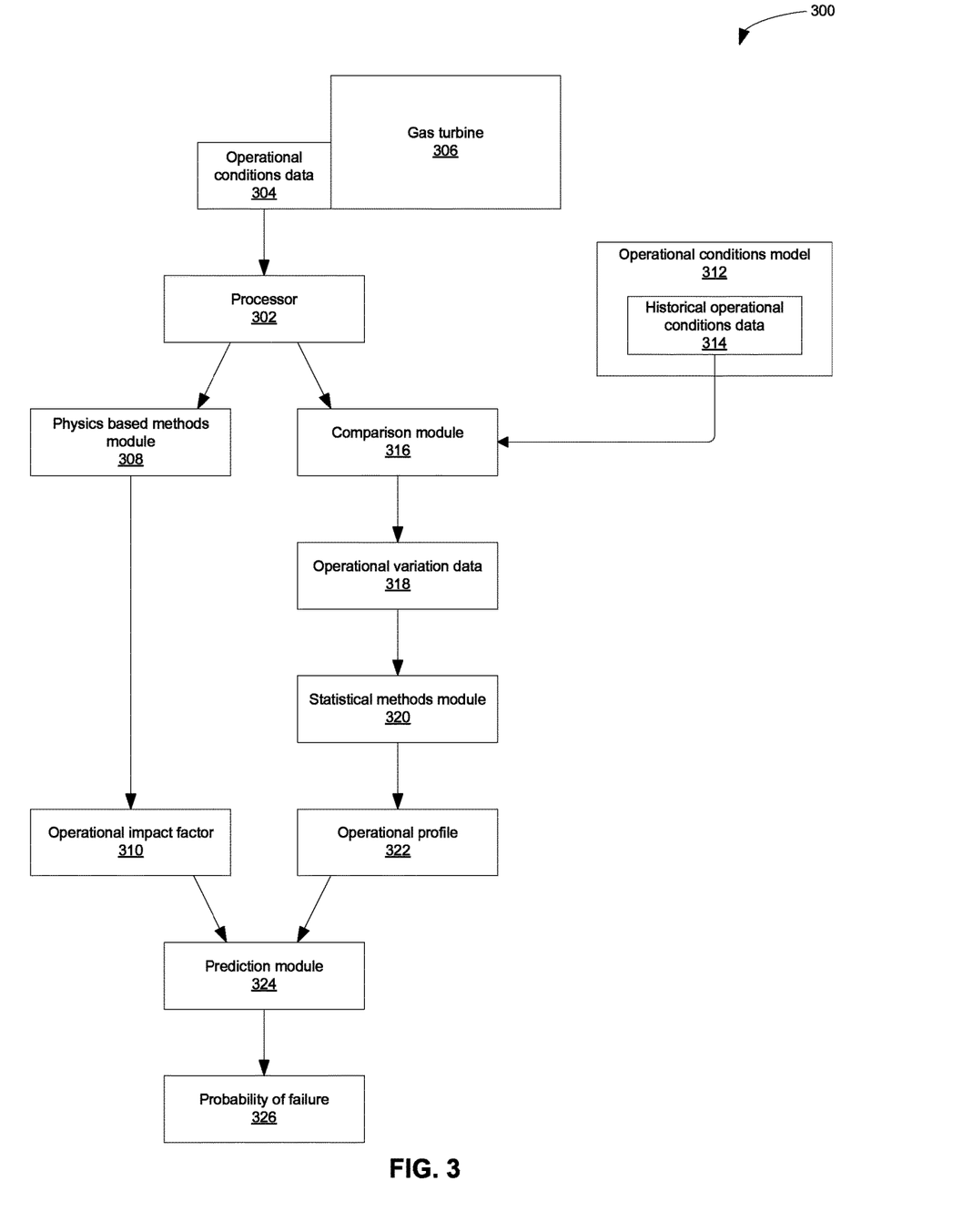
FIG. 3 is a flow diagram illustrating an example system for gas turbine operational impact modeling according to an embodiment of the disclosure.

FIG. 3 shows the components of an example system 300 for operational impact modeling according to an embodiment of the disclosure. A processor 302, or more than one processor, may receive operational conditions data 304 from one or more sensors associated with a gas turbine 306. The operational conditions data 304 may include one or more of a compressor discharge temperature, an ambient temperature, and a load of the gas turbine 306. A physics-based methods module 308 may process the operational conditions data 304, yielding an operational impact factor 310.

An operational conditions model 312 may include historical operational conditions data 314 associated with the operation of a plurality of gas turbines of the same type as the gas turbine 306 and of similar types, enabling the operational conditions model 312 to model various possible operating conditions of the gas turbine 306 and their effects on the service life of each of the one or more hardware components of the gas turbine 306.

A comparison module 316 may compare the operational conditions data 304 collected by the processor 302 to the historical operational conditions data 314 in the operational conditions model 312, yielding operational variation data 318. The operational variation data 318 may represent differences between the operational conditions data 304 and the historical operational conditions data 314 representing gas turbines operating under conditions similar to the conditions under which the gas turbine 306 is operating.

A statistical methods module 320 may analyze the operational variation data 318, yielding an operational profile 322. The operational profile 322 may include a set of operating conditions values that are characteristic of a particular type of operation, for example, operation under peak load or base load. A prediction module 324 may analyze the operational impact factor 310 and the operational profile 322 and yield a probability of failure 326. The probability of failure 326 may refer to the probability that a specific one of the one or more hardware components of the gas turbine 306 will fail within a specific service time if subject to a current or expected set of operating conditions. A failure associated with the probability of failure 326 may include one or more of an airslot cracking, an inner tang cracking, a combustor liner deformation, a combustor liner cracking, and a lockwire tap.

In some example embodiments, the one or more processors may be further operable to receive operating parameters from one or more controllers associated with the gas turbine 306. In some embodiments, the system 300 may include a feedback module operable to provide a feedback to a control module based at least in part on one or more of the operational conditions data, the operational impact factor, and the operational profile. In some embodiments, the historical operational conditions data 314 may be stored in a database. The database may be disposed within the operational conditions model 312 or may be a separate component of the system 300. The operational conditions model 312 may be operable to retrieve the operational conditions data 304 from the database. The physics-based methods module 308 may be further operable to incorporate the historical operational conditions data 314 into the generation of the operational impact factor 310.

In some embodiments, the operational variation data 318 may be stored in a database of historical operational variation data, the statistical methods module 320 being further operable to incorporate the historical operational variation data into the generation of the operational profile 322.

Figure 4:
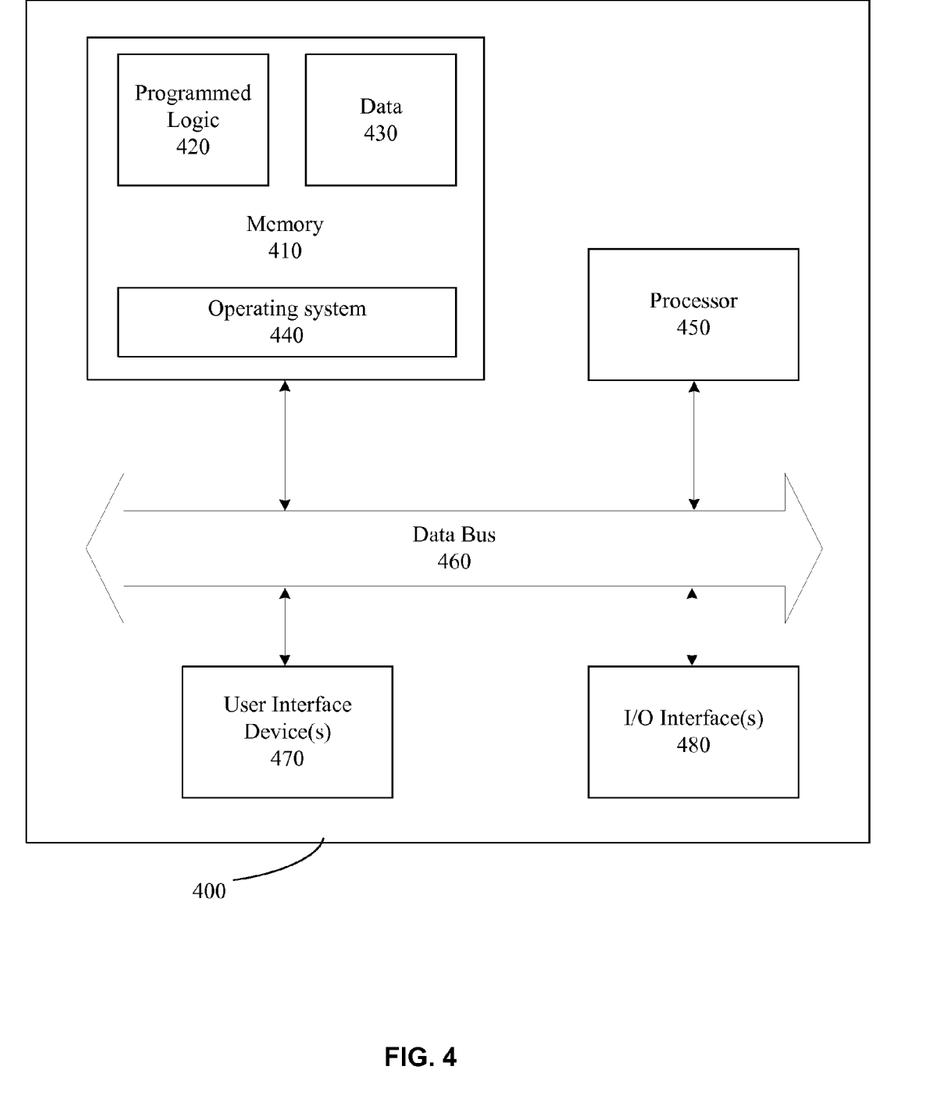
FIG. 4 is a block diagram illustrating an example controller 400 for controlling a gas turbine according to an embodiment of the disclosure.

FIG. 4 depicts a block diagram illustrating an example controller 400 for controlling a gas turbine according to an embodiment of the disclosure. More specifically, components of the controller 400 may be used to implement a method for operational impact modeling including receiving, by one or more processors, operational conditions data associated with a hardware component of a gas turbine; based at least in part on the operational variation data, applying, by one or more processors, statistical methods to establish an operational profile of the hardware component;

receiving, by one or more processors, operating parameters and operational conditions data associated with the hardware component; based at least in part on the operating parameters and the operational conditions data, applying, by one or more processors, physics-based methods to establish an operational impact factor of the hardware component; and based at least in part on the operational profile and the operational impact factor determining, by one or more processors, a probability of a failure of the hardware component within a time period.

The controller 400 may include a memory 410 that stores programmed logic 420 (e.g., software) and may store data 430, such as operational data associated with the gas turbine, the set of constants, and the like. The memory 410 also may include an operating system 440.

A processor 450 may utilize the operating system 440 to execute the programmed logic 420, and in doing so, may also utilize the data 430. A data bus 460 may provide communication between the memory 410 and the processor 450. Users may interface with the controller 400 via at least one user interface device 470, such as a keyboard, mouse, control panel, or any other devices capable of communicating data to and from the controller 400. The controller 400 may be in communication with the gas turbine and a camera via an input/output (I/O) interface 480.

Additionally, it should be appreciated that other external devices or multiple other gas turbines may be in communication with the controller 400 via the I/O interface 480. In the illustrated embodiment, the controller 400 may be located remotely with respect to the gas turbine; however, it may be co-located or even integrated with the gas turbine. Further, the controller 400 and the programmed logic 420 implemented thereby may include software, hardware, firmware, or any combination thereof. It should also be appreciated that multiple controllers 400 may be used, whereby different features described herein may be executed on one or more different controllers 400.

Accordingly, certain embodiments described herein can provide data for on-line monitoring of hot gas path components of a gas turbine during the turbine operation for early identification of anomalies associated with the hot gas path components. The disclosed methods and systems allow preventing major damage to the turbine components and decrease turbine downtime.

References are made to block diagrams of systems, methods, apparatuses, and computer program products according to example embodiments. It will be understood that at least some of the blocks of the block diagrams, and combinations of blocks in the block diagrams, may be implemented at least partially by computer program instructions. These computer program instructions may be loaded onto a general purpose computer, special purpose computer, special purpose hardware-based computer, or other programmable data processing apparatus to produce a machine, such that the instructions which execute on the computer or other programmable data processing apparatus create means for implementing the functionality of at least some of the blocks of the block diagrams, or combinations of blocks in the block diagrams discussed.

These computer program instructions may also be stored in a computer-readable memory that can direct a computer or other programmable data processing apparatus to function in a particular manner, such that the instructions stored in the computer-readable memory produce an article of manufacture including instruction means that implement the function specified in the block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the block or blocks.

One or more components of the systems and one or more elements of the methods described herein may be implemented through an application program running on an operating system of a computer. They also may be practiced with other computer system configurations, including handheld devices, multiprocessor systems, microprocessor based or programmable consumer electronics, mini-computers, mainframe computers, and the like.

Application programs that are components of the systems and methods described herein may include routines, programs, components, data structures, and so forth that implement certain abstract data types and perform certain tasks or actions. In a distributed computing environment, the application program (in whole or in part) may be located in local memory or in other storage. In addition, or alternatively, the application program (in whole or in part) may be located in remote memory or in storage to allow for circumstances where tasks are performed by remote processing devices linked through a communications network.

Many modifications and other embodiments of the example descriptions set forth herein to which these descriptions pertain will come to mind having the benefit of the teachings presented in the foregoing descriptions and the associated drawings. Thus, it will be appreciated that the disclosure may be embodied in many forms and should not be limited to the example embodiments described above.

Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A method for operational impact modeling, the method comprising:
   receiving, by one or more processors, operational conditions data associated with a hardware component of a gas turbine;
   based at least in part on operational variation data, applying, by the one or more processors, statistical methods to establish an operational profile of the hardware component wherein establishing the operational profile comprises:
   receiving historical operational variation data associated with reference hardware components;
   comparing, using one or more statistical algorithms, the operational variation data associated with the hardware component to the historical operational variation data associated with the reference hardware components: and
      based at least in part on the comparison, profiling the hardware component, the profiling including attributing hardware failures of the reference hardware components operating under substantially similar operational variations to the hardware component:
      receiving, by the one or more processors, operating parameters data-associated with the hardware component;
   based at least in part on the operating parameters and the operational conditions data, applying, by the one or more processors, physics-based methods to establish an operational impact factor of the hardware component;

based at least in part on the operational profile and the operational impact factor determining, by the one or more processors, a probability of a failure of the hardware component within a time period; and based on the probability of the failure, adjusting the operating parameters associated with the hardware component.

2. The method of claim 1, further comprising:
triggering, by the one or more processors, one or more remedial actions to lower the probability of the failure.

3. The method of claim 2, wherein the one or more remedial actions include activating one or more inlet chillers associated with the gas turbine.

4. The method of claim 1, wherein the operational conditions data is received from one or more sensors installed in the gas turbine.

5. The method of claim 1, wherein the operational conditions data comprises one or more of the following: a compressor discharge temperature, an ambient temperature, DRY load NOx mode of operation, firing temperature, and load of the gas turbine.

6. The method of claim 1, wherein the failure of the hardware component comprises one or more of the following: an airslot cracking, an inner tang cracking, a combustor liner deformation, a combustor liner cracking, and a lock-wire tap.

7. The method of claim 1, wherein establishing the operational impact factor comprises:
receiving, by the one or more processors, historical operational conditions data;
based on the historical operational conditions data, determining, by the one or more processors using statistical methods, representative operational cycles;
matching operational cycles of the hardware component to the representative operational cycles; and
computing a value of the operational impact factor, the operational impact factor being a proportion of a rate of failure of the reference hardware components in the matching operational cycles to a rate of failure in the reference hardware component.

8. The method of claim 7, wherein the reference operational cycles include a base load.

9. The method of claim 1, further comprising:
determining, based on the probability of a failure of the hardware component within a time period, a hardware component inspection frequency.

10. The method of claim 1, wherein the operating parameters comprise fuel pattern variations.

11. The method of claim 1, further comprising:
applying, by the one or more processors, a cluster analysis to identify similar types of clusters to determine a mission profile.

12. A system for operational impact modeling, the system comprising:
one or more processors operable to:
receive operational conditions data from one or more sensors associated with a gas turbine; and
based on a probability of the failure, adjust operating parameters associated with a hardware component;
a physics based analysis technique operable to generate an operational impact factor based at least in part on the operational conditions data;
a database and real time operational model including historical operational conditions data associated with the hardware component of the gas turbine;
a comparison module operable to generate operational variation data based at least on the operational conditions data and the historical operational conditions data and real-time operational conditions data;
a statistical methods module operable to generate an operational profile based at least in part on the operational variation data, wherein, when generating the operational profile, the statistical methods module is operable to:
receive historical operational variation data associated with reference hardware components;
compare, using one or more statistical algorithms, the operational variation data associated with the hardware component to the historical operational variation data associated with the reference hardware components; and
based at least in part on the comparison, profile the hardware component, the profiling including attributing hardware failures of the reference hardware components operating under substantially similar operational variations to the hardware component; and
a prediction module operable to generate the probability of a failure of the hardware component within a specified time period based at least in part on the operational impact factor and the operational profile.

13. The system of claim 12, wherein:
the one or more processors are further operable to receive the operating parameters from one or more controllers associated with the gas turbine; and
the physics based methods module is further operable to compute the operational impact factor based on the operating parameters.

14. The system of claim 13, further comprising:
a feedback module operable to provide feedback to a control module based at least in part on one or more of the operational conditions data, the operational impact factor, and the operational profile.

15. The system of claim 12, further comprising:
a database of historical operational conditions data, the physics-based methods module being further operable to incorporate the historical operational conditions data into the generation of the operational impact factor.

16. The system of claim 12, further comprising:
a database of the historical operational variation data, the statistical methods module being further operable to incorporate the historical operational variation data into the generation of the operational profile.

17. The system of claim 12, wherein the operational conditions data comprise one or more of the following: a compressor discharge temperature, an ambient temperature, DRY load NOx mode of operation, firing temperature, and a load of the gas turbine.

18. The system of claim 12, wherein the failure of the hardware component comprises one or more of the following: an airslot cracking, an inner tang cracking, a combustor liner deformation, a combustor liner cracking, and a lock-wire tap.

19. A non-transitory computer-readable storage medium having embodied thereon a program, the program being executable by a processor to perform a method for operational impact modeling, the method comprising:
receiving, by one or more processors, operational variation data associated with a hardware component of a gas turbine;
based at least in part on the operational variation data, applying, by the one or more processors, statistical methods to establish an operational profile of the hardware component, wherein establishing the operational profile comprises:
  receiving historical operational variation data associated with reference hardware components;
  comparing, using one or more statistical algorithms, the operational variation data associated with the hardware component to the historical operational variation data associated with the reference hardware components; and
  based at least in part on the comparison, profiling the hardware component, the profiling including attributing hardware failures of the reference hardware components operating under substantially similar operational variations to the hardware component;
receiving, by the one or more processors, operating parameters data and operational conditions data associated with the hardware component;
based at least in part on the operating parameters data and the operational conditions data, applying, by the one or more processors, physics-based methods to establish an operational impact factor of the hardware component; and
based at least in part on the operational profile and the operational impact factor determining, by the one or more processors, a probability of a failure of the hardware component within a time period; and
based on the probability of the failure, adjusting the operating parameters associated with the hardware component.

* * * * *